US009263203B2

(12) United States Patent
Stiehl et al.

(10) Patent No.: US 9,263,203 B2
(45) Date of Patent: Feb. 16, 2016

(54) IN CABLE MICRO INPUT DEVICES

(71) Applicant: Apple Inc., Cupertino, CA (US)

(72) Inventors: Kurt Stiehl, San Jose, CA (US); Michelle Yu, Oakland, CA (US); Wilhelmus M. C. Crooijmans, San Jose, CA (US); Cameron Frazier, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 61 days.

(21) Appl. No.: 13/909,925

(22) Filed: Jun. 4, 2013

(65) Prior Publication Data

US 2013/0341168 A1 Dec. 26, 2013

Related U.S. Application Data

(63) Continuation of application No. 12/203,872, filed on Sep. 3, 2008, now Pat. No. 8,456,864.

(60) Provisional application No. 60/995,658, filed on Sep. 26, 2007.

(51) Int. Cl.

| | |
|---|---|
| ***H05K 7/02*** | (2006.01) |
| ***H05K 7/04*** | (2006.01) |
| ***H01H 9/02*** | (2006.01) |
| ***H04R 1/08*** | (2006.01) |
| *H01H 23/00* | (2006.01) |

(52) U.S. Cl.

CPC ............... *H01H 9/02* (2013.01); *H01H 9/0228* (2013.01); *H04R 1/083* (2013.01); *H01H 23/003* (2013.01); *H01H 2209/012* (2013.01)

(58) Field of Classification Search

USPC ............................ 361/810; 439/587; 200/295

See application file for complete search history.

(56) References Cited

U.S. PATENT DOCUMENTS

| | | | | |
|---|---|---|---|---|
| 3,986,161 | A * | 10/1976 | MacKellar .................... | 367/118 |
| 4,395,610 | A | 7/1983 | Downs et al. | |
| 5,315,682 | A | 5/1994 | Daguet et al. | |
| 5,821,480 | A | 10/1998 | Machida | |
| 6,007,377 | A * | 12/1999 | Cook ............................ | 439/587 |
| 8,036,413 | B2 | 10/2011 | Kim | |
| 2010/0123632 | A1 * | 5/2010 | Hill et al. ...................... | 343/702 |

* cited by examiner

*Primary Examiner* — Andargie M Aychillhum

(74) *Attorney, Agent, or Firm* — Brownstein Hyatt Farber Schreck, LLP

(57) ABSTRACT

A small form-factor input device operative to be coupled to an electronic device using a cable may include a circuit board; a first electrical switch disposed on a first side of the circuit board; a second electrical switch disposed on a second side of the circuit board; a frame defining a periphery, wherein the circuit board is maintained within the periphery of the frame; first and second shells that house the circuit board, the first shell placed over the first side of the circuit board, and the second shell placed over the second side of the circuit board; and at least one clip coupled to each one of the first shell and the second shell, wherein the at least one clip is operative to engage the frame.

22 Claims, 10 Drawing Sheets

IN CABLE MICRO INPUT DEVICES

CROSS REFERENCE TO RELATED APPLICATIONS

This application is a continuation patent application of U.S. patent application Ser. No. 12/203,872, filed Sep. 3, 2008 and titled "In Cable Micro Input Devices," which claims the benefit of and priority to U.S. Provisional Patent Application No. 60/995,658, filed Sep. 26, 2007 and titled "In Cable Micro Input Devices," which are hereby incorporated herein by reference in their entireties.

BACKGROUND

Small devices that allow a user to provide inputs to electrical devices are useful for the operation of such devices.

SUMMARY

In certain embodiments, the present description provides for an input device for providing one or more inputs to an electrical device, the input device including a circuit board having first and second sides; a first electrical switch disposed on the first side of the circuit board; a second electrical switch disposed on the first side of the circuit board; and a third electrical switch, disposed on the second side of the circuit board.

In some embodiments, the input device further comprises a frame that extends the length of the circuit board, for example, wherein the frame defines a periphery and the circuit board is maintained within the periphery of the frame. In certain instances, the circuit board is weaved above and below first and second portions of the frame.

In some embodiments, the input device further comprises top and bottom shells that house the circuit board, the top shell placed over the first side of the circuit board, and the bottom shell placed over the second side of the circuit board. In certain instances, at least one of the top shell and the bottom shell is secured to the frame. In certain embodiments, the input device further comprises at least one clip coupled to at least one of the top shell and the bottom shell, wherein at least one of the top shell and the bottom shell is secured to the frame by engaging at least one clip to the frame. In some instances, at least one clip is coupled to at least one of the top shell and the bottom shell through shape-welding.

In certain embodiments, the circuit board is flexible such that the circuit board flexes when the top shell is pressed towards the bottom shell. In some embodiments, the circuit board is flexible such that the circuit board flexes when the bottom shell is pressed towards the top shell. In certain embodiments, the circuit board is flexible such that the circuit board flexes when the top shell and the bottom shell are pressed towards one another.

In some embodiments, the circuit board is free standing (e.g., not fixedly coupled) within the input device.

In certain embodiments, the input device further comprises a pivot positioned at a center portion of the circuit board so that the circuit board is pivotable about the pivot.

In some embodiments, the input device further comprises a microphone. In certain such embodiments, at least one of the top shell and the bottom shell includes a longitudinally extending slit. In some embodiments, the input device further comprises a longitudinally extending gap between the top shell and the bottom shell.

In some embodiments, the input device further comprises a standoff located between the first electrical switch and the top shell, the standoff being in contact with the first electrical switch and the top shell.

In certain embodiments, the input device further comprises a plate located between the first electrical switch and the top shell, the plate being in contact with the first electrical switch, the second electrical switch, and the top shell. For example, in some cases, the input device further comprises a standoff located between the plate and the top shell, the standoff being in contact with the first electrical switch, via the plate, and the top shell. In some instances, the input device further comprises a pivot positioned near a center portion of the plate so that the plate is pivotable about the pivot.

In certain embodiments, the present description provides for an input device for providing one or more inputs to an electrical device, the input device including a flexible circuit board having first and second sides; a first electrical switch disposed on the first side of the circuit board; and top and bottom shells that house the circuit board, the top shell placed over the first side of the circuit board, and the bottom shell placed over the second side of the circuit board; wherein the circuit board flexes when at least one of the top shell is pressed towards the bottom shell, the bottom shell is pressed towards the top shell, and both the top and bottom shells are pressed towards one another. In some such embodiments, the input device further comprises a second electrical switch disposed on the first side of the circuit board; and a third electrical switch disposed on the second side of the circuit board. In certain embodiments, the circuit board is free standing (e.g., not fixedly coupled) within the device. In some embodiments, the input device further comprises a pivot positioned at a center portion of the circuit board so that the circuit board is pivotable about the pivot.

In certain embodiments, the present description provides for an input device for providing one or more inputs to an electrical device, the input device including a circuit board having first and second sides, the circuit board being free standing (e.g., not fixedly coupled) within the input device; a first electrical switch disposed on the first side of the circuit board; and a frame that defines a periphery and extends the length of the circuit board, the circuit board being maintained within the periphery of the frame. In some such embodiments, the input device further comprises a second electrical switch disposed on the first side of the circuit board; and a third electrical switch disposed on the second side of the circuit board. In certain embodiments, the circuit board is flexible such that the circuit board flexes when at least one of the top shell is pressed towards the bottom shell, the bottom shell is pressed towards the top shell, and both the top and bottom shells are pressed towards one another. In some embodiments, the input device further comprises a pivot positioned at a center portion of the circuit board so that the circuit board is pivotable about the pivot.

In certain embodiments, the present description provides for an input device for providing one or more inputs to an electrical device, the input device including a circuit board having first and second sides; a first electrical switch disposed on the first side of the circuit board; a second electrical switch disposed on the first side of the circuit board; a third electrical switch disposed on the second side of the circuit board; a frame defining a periphery, wherein the circuit board is maintained within the periphery of the frame; top and bottom shells that house the circuit board, the top shell placed over the first side of the circuit board, and the bottom shell placed over the second side of the circuit board; and at least one clip coupled to each one of the top shell and the bottom shell, wherein the at least one clip is operative to engage the frame.

BRIEF DESCRIPTION OF THE DRAWINGS

The following figures depict illustrative embodiments of the invention in which like reference numerals refer to like elements. These depicted embodiments may not be drawn to scale and are to be understood as illustrative and not as limiting in any way.

DETAILED DESCRIPTION

Figure 1:
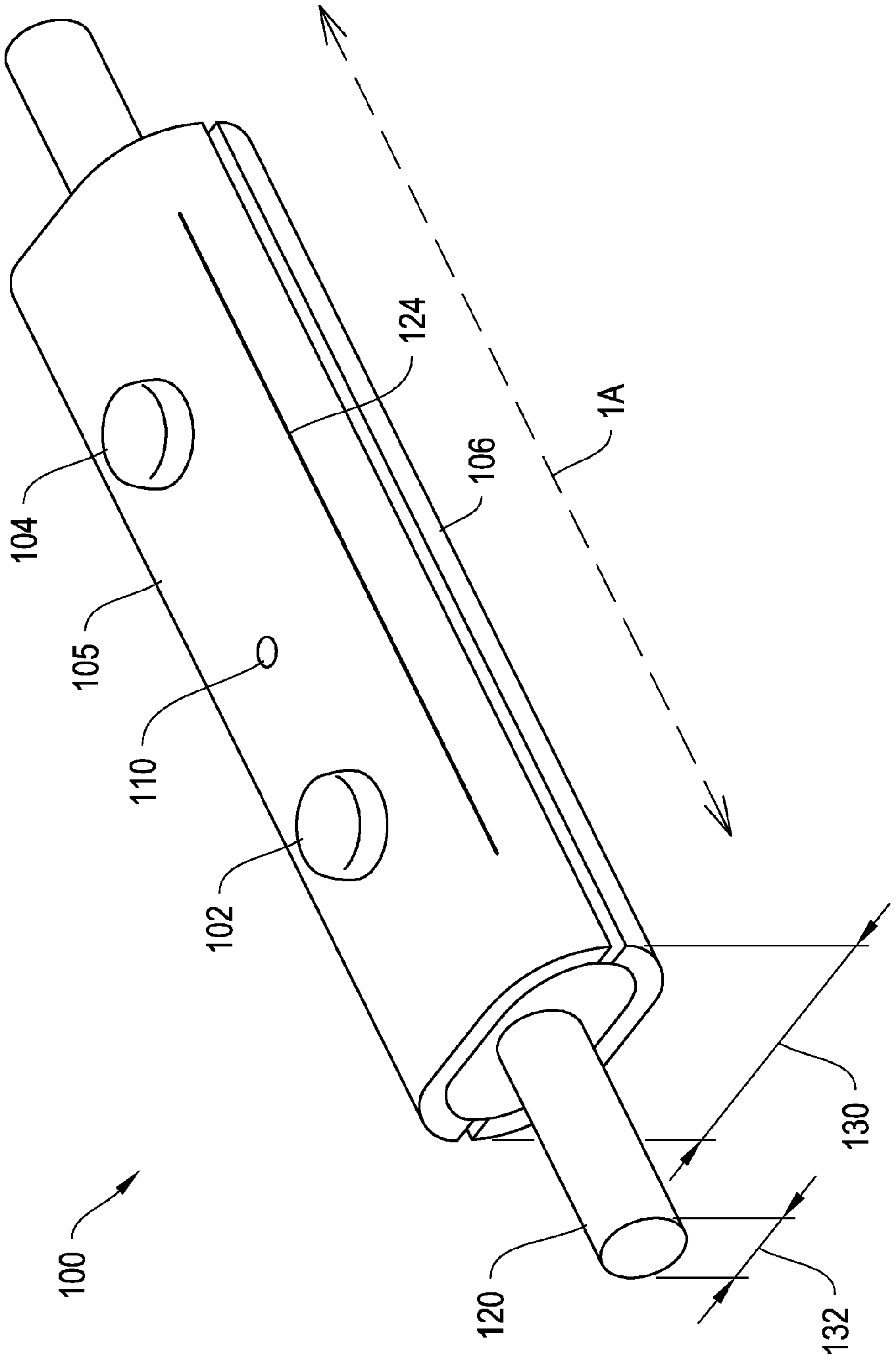
FIG. 1 is a schematic view of an input device in accordance with one embodiment of the invention.

The objects and advantages of the claimed invention will be apparent upon consideration of the following detailed description, taken in conjunction with the accompanying drawings, in which like reference characters refer to like parts throughout.

A user may provide inputs to an electronic device using a number of approaches. In some embodiments, an input device may be coupled to the electronic device. FIG. 1 is a perspective schematic view of an input device 100 in accordance with one embodiment of the invention. The input device 100 may be coupled to an electronic device using a cable or wire 120.

The input device 100 may be formed from a top shell 105 and a bottom shell 106, which may be made in whole or in part from plastic and/or metal (such as aluminum or stainless steel), or a composite material. The input device 100 may include one or more input mechanisms for providing distinct inputs to the electronic device. In some embodiments, the input device 100 may include an internal button or switch (not pictured), such as an electrical switch, actuated by pressing the top shell 105 and the bottom shell 106 together. In some embodiments, the input device 100 may include one or both of external buttons 102 and 104 operative to be pressed to provide inputs. Although illustrated with substantially circular cross-sections in FIG. 1, the buttons 102 and 104 may have other suitable cross-sectional shapes, including rectangular, triangular, oval, etc., which may be the same or different from one another. For example, the shape of the buttons 102 and 104 may signify a particular input to the electronic device, such as a triangle to indicate playing or searching of sound (e.g., music), video (e.g., movies), or data in a particular direction. When in use, the user may be able to sense the shape of the button, and thus the associated input, on touch and without the need for visual confirmation.

The input device 100 may include on the top shell 105 an aperture 110 operative to allow audio (e.g., from a user's voice) to pass to a microphone within the input device 100. In some embodiments, the input device may include an aperture (not pictured) on the bottom shell 106 in addition to or instead of the aperture 110. In other embodiments, the input device 100 may include one or more additional apertures on the top shell 105 or on the bottom shell 106. In some embodiments, the input device 100 does not include a microphone.

In an alternate embodiment, the input device 100 may include the internal microphone but not include the aperture 110. In such embodiments, there may be one or more cracks, partitions, gaps, or separations between the top shell 105 and the bottom shell 106, for example, when there is not a tight seal between the two shells. Such cracks, partitions, gaps, or separations may allow sound waves to pass between the shells and to the internal microphone. The top shell 105 or the bottom shell 106 may instead or in addition include one or more slits 124, which also permits sound waves to pass through the shells and to the internal microphone. In some instances, the slits 124 may extend substantially parallel to the longitudinal axis 1A of the input device 100 and thus be substantially parallel to the cable 120 and to any wires passing longitudinally through the device 100. In certain embodiments, the device 100 includes a gap between the top shell 105 and the bottom shell 106, such as a longitudinally extending gap, which also permits sound waves to pass through the shells and to the internal microphone. In some instances, the gap is simply the small space that is incidental to the joining of the top and bottom shells 105 and 106 or the coupling of the top and bottom shells to the device 100 (e.g., via the frame, as discussed in detail below). The combination of the internal microphone, the aperture 110, the slit 124, and the gap may also be used in combination with other input devices described herein (e.g., 300, 400, 800, and 900).

In certain instances, the input device 100 (and the input devices 300, 400, 800, and 900, as described in further detail below) is significantly larger in width than the connecting cable or wire 120. For example, the width 130 of the input device 100 may be about 3, 4, 5, 7, or 10 times greater than the width 132 of the connecting cable or wire 120. In other embodiments, the input device 100 is not significantly larger in width than the connecting cable or wire 120. For example, the width 130 of the input device 100 may be less than about 3 times the width 132 of the connecting cable or wire 120. For example, the width 130 of the input device may be about 1.2, 1.5, 2, or 2.5 times the width 132 of the cable or wire. In further embodiments, the input device 100 may have a width 130 substantially similar to the width 132 of the connecting cable or wire 120, for example, a width 130 about equal or within about 20%, 10%, or 5% of the width 132.

Figure 2:
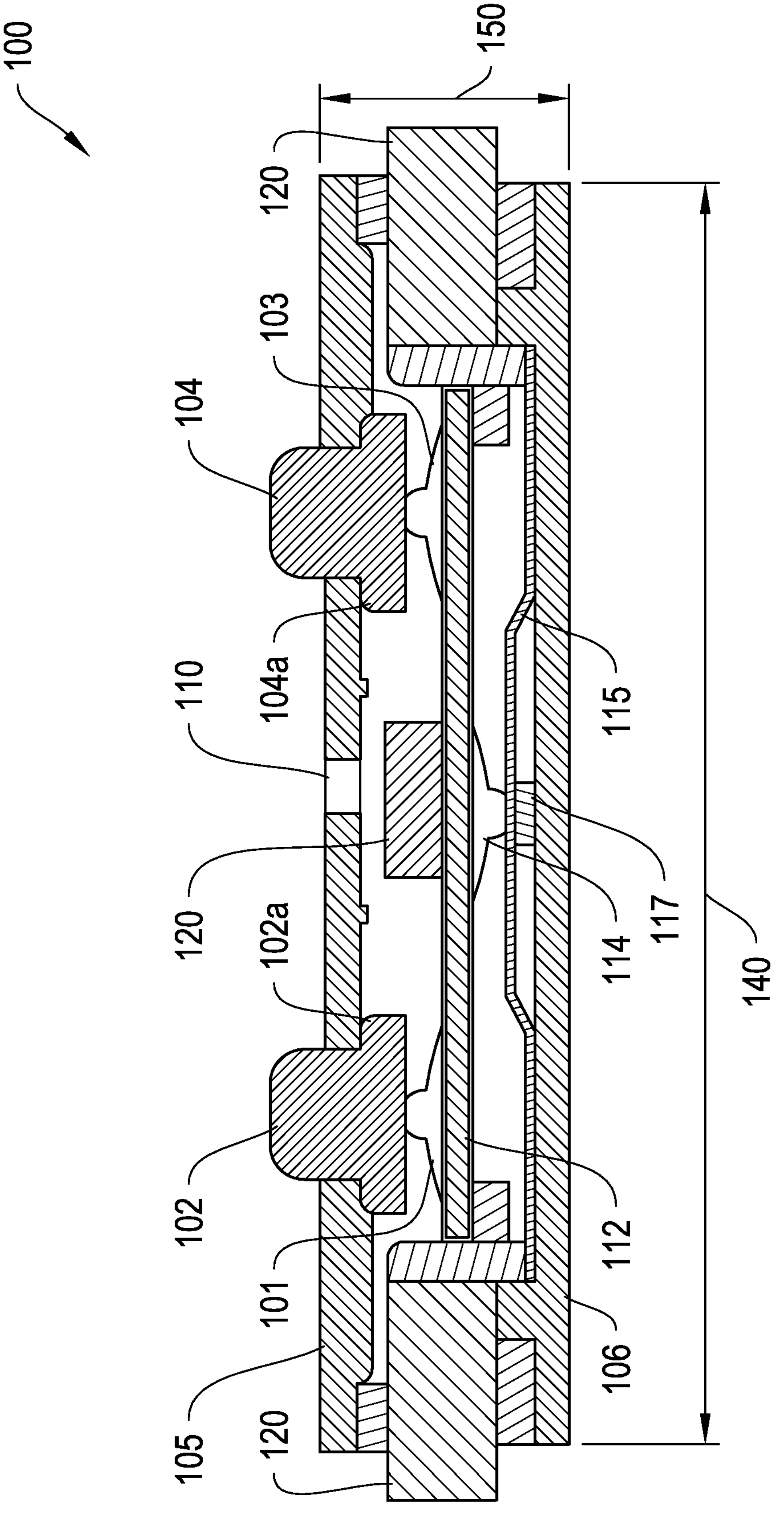
FIG. 2 is a cross-sectional view of the input device of FIG. 1 in accordance with one embodiment of the invention.

FIG. 2 is a cross-sectional view of the input device 100 of FIG. 1 in accordance with one embodiment of the invention. The input device 100 may include one or more components operative to transmit inputs received from a user to an electronic device. The input device 100 may include a circuit board 112 on which various electronic components may be mounted. In certain instances, the board 112 is flexible, i.e., it is capable of flexing or bending during the normal course of use.

The input device 100 may include a switch 101 (e.g., an electrical switch), located behind the button 102, and a switch 103 (e.g., an electrical switch), located behind the button 104, such that each of the switches 101 and 103 are coupled to the circuit board 112. In some instances, when one or both of the buttons 102 and 104 are depressed, the switches 101 and 103, respectively, may be shorted and provide an electrical signal to transmit an input to an electronic device. The buttons 102 and 104 may include flanges 102*a* and 104*a*, respectively. The flanges 102*a* and 104*a* may lie within the input device 100, e.g., between the top shell 105 and the bottom shell 106. The flanges 102*a* and 104*a* may also be larger in one or more dimensions than the remainder of the buttons 102 and 104 (for example, in width, length, circumference, or diameter) and also larger than the apertures in the top shell 105 through which the buttons 102 and 104 protrude, thereby facilitating retention of the buttons by the input device 100, such as by abutment with an internal portion of the top shell.

The input device 100 may include a switch 114 (e.g., an electrical switch), which may be coupled to the circuit board 112. As shown in FIG. 2, in some embodiments, the switch 114 may be coupled to the side of circuit board 112 opposite to the side on which the switches 101 and 103 are coupled. In other embodiments (not pictured), the switch 114 may be coupled to the same side of the circuit board 112 on which the switches 101 and 103 are coupled. The switch 114 may be placed in direct or indirect contact with a plate 115, which may be coupled directly or indirectly to the bottom shell 106. In some instances, a standoff 117 is positioned between the plate 115 and the bottom shell 106. Aspects of the standoff are discussed in further detail below. When the bottom shell 106 is pressed towards top shell 105, for example, when the top shell 105 and the bottom shell 106 are pressed together, the switch 114 may be actuated. In particular, in certain embodiments, pressing of the bottom shell 106 may cause the plate 115 to depress switch 114, shorting the switch and providing an electrical signal to transmit an input to the electronic device.

In some embodiments, the input device 100 may include a microphone 120. The microphone 120 may be placed adjacent the aperture 110 to facilitate sound waves traveling through the top shell 105 into the microphone 120. The microphone 120 may be coupled to the circuit board 112 for transmitting electrical signals associated with the received sound waves to an electronic device coupled to the input device 100. In some embodiments, the microphone 120 is positioned at a center portion of the circuit board 112. As noted above, in certain embodiments, the input device 100 includes the microphone 120 but does not include the aperture 110.

The input device 100 (and input devices 300, 400, 800 and 900, as described in further detail below) may be constructed to have any suitable dimensions. In some embodiments, the total length 140 of the device 100 may be about 19 mm±2 mm, and total height 150 of the device 100 may be about 3.7 mm±1 mm. The different components of the input device 100 may have any suitable dimensions. For example, the shells 105 and 106 may have thicknesses of about 0.5 mm±0.1 mm. The switches 101, 103, and 114 may have heights of 0.5 mm±10%. The circuit board 112 may have a thickness of 0.5 mm±10%. The microphone 120 may have a height of 1.25 mm±10%. The flanges 102*a* and 104*a* of buttons 102 and 104, respectively, may have thicknesses of 0.75 mm±10%.

Figure 3:
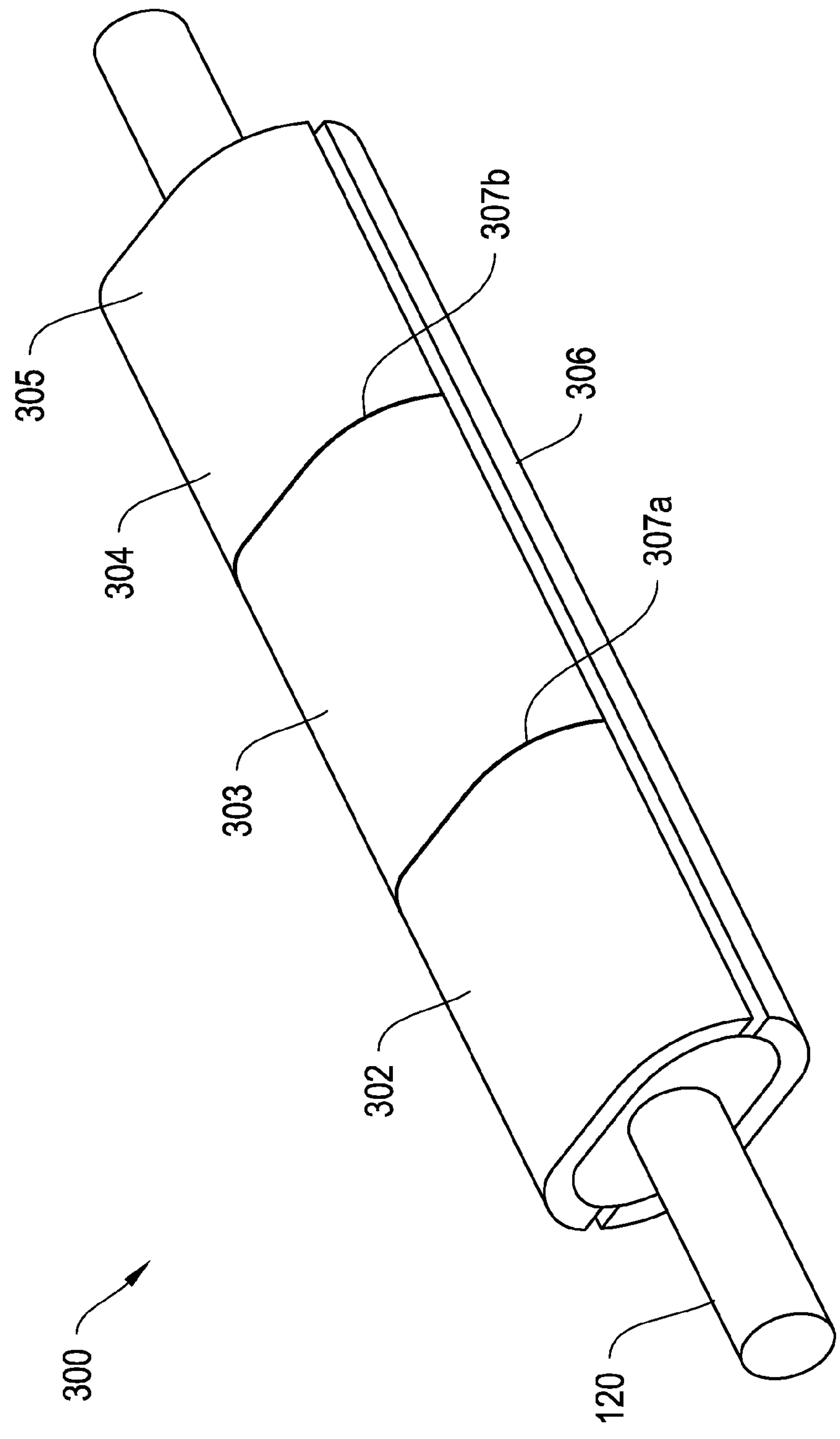
FIG. 3 is a schematic view of an input device having internal buttons in accordance with one embodiment of the invention.

FIG. 3 is a perspective schematic view of an input device 300 having internal buttons in accordance with one embodiment of the invention. The input device 300 may include one or more internal buttons or switches (e.g., electrical switches) operative to be actuated independently. The input device 300 may include a top shell 305 and a bottom shell 306. The top shell 305 may be formed by three distinct portions 302, 303, and 304, each defining a button. For example, the top shell 305 may include a first button 302, a second button 303, and a third button 304. In some embodiments (not pictured), the second button 303 is absent from the top shell 305 and is a component of the bottom shell 306.

Although in FIG. 3 the input device 300 is depicted as having the three distinct portions 302, 303, and 304 separated by partitions 307*a* and 307*b*, in other embodiments, two or more portions may not be distinguished by partition(s) but rather by the raised or lowered surface of the top shell 305. For example, in one embodiment (not pictured), the center portion 303 includes a surface of the top shell 305 that is lowered relative to that of the left portion 302 and the right portion 304. In an alternate embodiment (not pictured), the center portion 303 includes a surface of the top shell 305 that is raised relative to that of the left portion 302 and the right portion 304. The lowering or raising of the center portion 303 relative to the left and right portions 302 and 304 permits the user to distinguish between buttons 302, 303, and 304 based on touch and without visual confirmation.

In other instances (not pictured), the top shell 305 may include more than three distinct portions each defining a button, e.g., four, five, six, or more portions and/or buttons.

As depicted in FIG. 3, the external surfaces of the buttons 302, 303, and 304 may be relatively smooth or flat. In other embodiments, the external surfaces of the buttons 302, 303, and 304 may include texture or surface features that may be the same or different from one another. In one instance, one or more of the buttons 302, 303, and 304 may include texture or surface features that signify a particular input, for example, so that the user may be able to sense the texture or surface features, and thus the associated input, on touch and without the need for visual confirmation.

Figure 4:
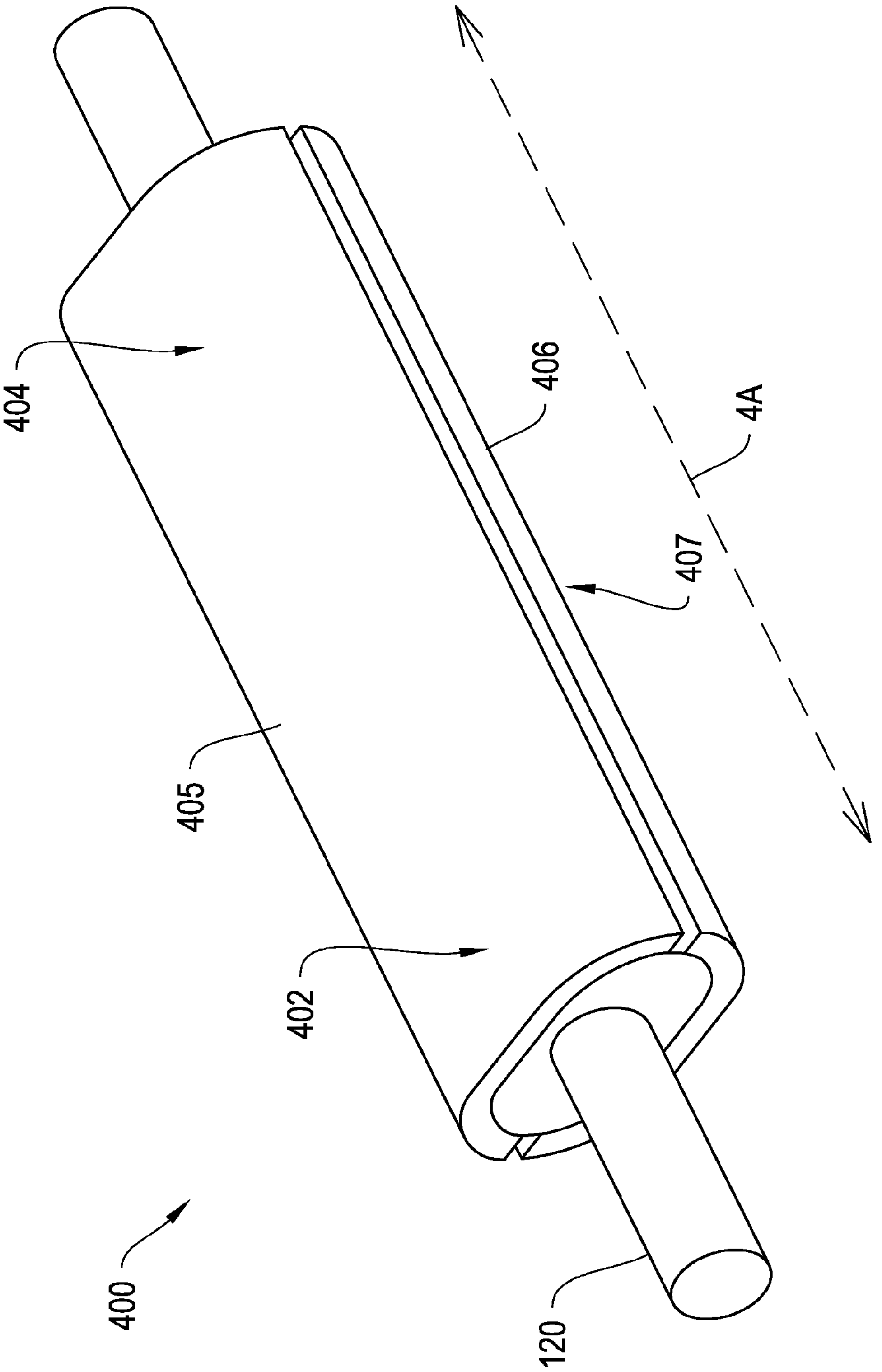
FIG. 4 is a schematic view of another input device having internal buttons in accordance with one embodiment of the invention.

FIG. 4 is a perspective schematic view of another input device 400 having internal buttons in accordance with one embodiment of the invention. The input device 400 may include one or more internal buttons operative to be actuated independently. The input device 400 may include a top shell 405 and a bottom shell 406. The top shell 405 and the bottom shell 406 may each be formed from a single piece of material. The input device 400 may be operative to provide different electrical signals based on the locations of the top shell 405 and the bottom shell 406 that are pressed together. For example, when the leftmost section 402 of the top shell 405 is pressed toward the bottom shell 406, a different electrical signal may be provided than when the rightmost section 404 is pressed toward the bottom shell 406.

The top shell 405, the bottom shell 406, or both may be flexible to facilitate pressing of the two shells together to actuate the internal switches. The flexibility of the shells maybe adjusted by using materials, such as plastics or metals of varying flexibility and hardness. For example, use of a relatively flexible plastic may facilitate actuation of the internal switches, whereas use of a harder and less-flexible plastic may hinder switch actuation. In one embodiment, when both the top shell 405 and the bottom shell 406 are flexible, a given shell can be depressed by a lesser amount (for example, by half the amount) to activate a switch than if only one of the shells were flexible. Analogously, if only one of the top shell 405 or the bottom shell 406 is flexible, this shell can be depressed by a greater amount (for example, by about twice the amount) to activate a switch than if both shells were flexible.

The input device 400 may also include a center section 407 on the bottom shell 406 that provides an electrical signal when pressed toward the top section 405. In other instances (not pictured), the center section 407 may be located on the top section 405 between the left most section 402 and the rightmost section 405.

Figure 5:
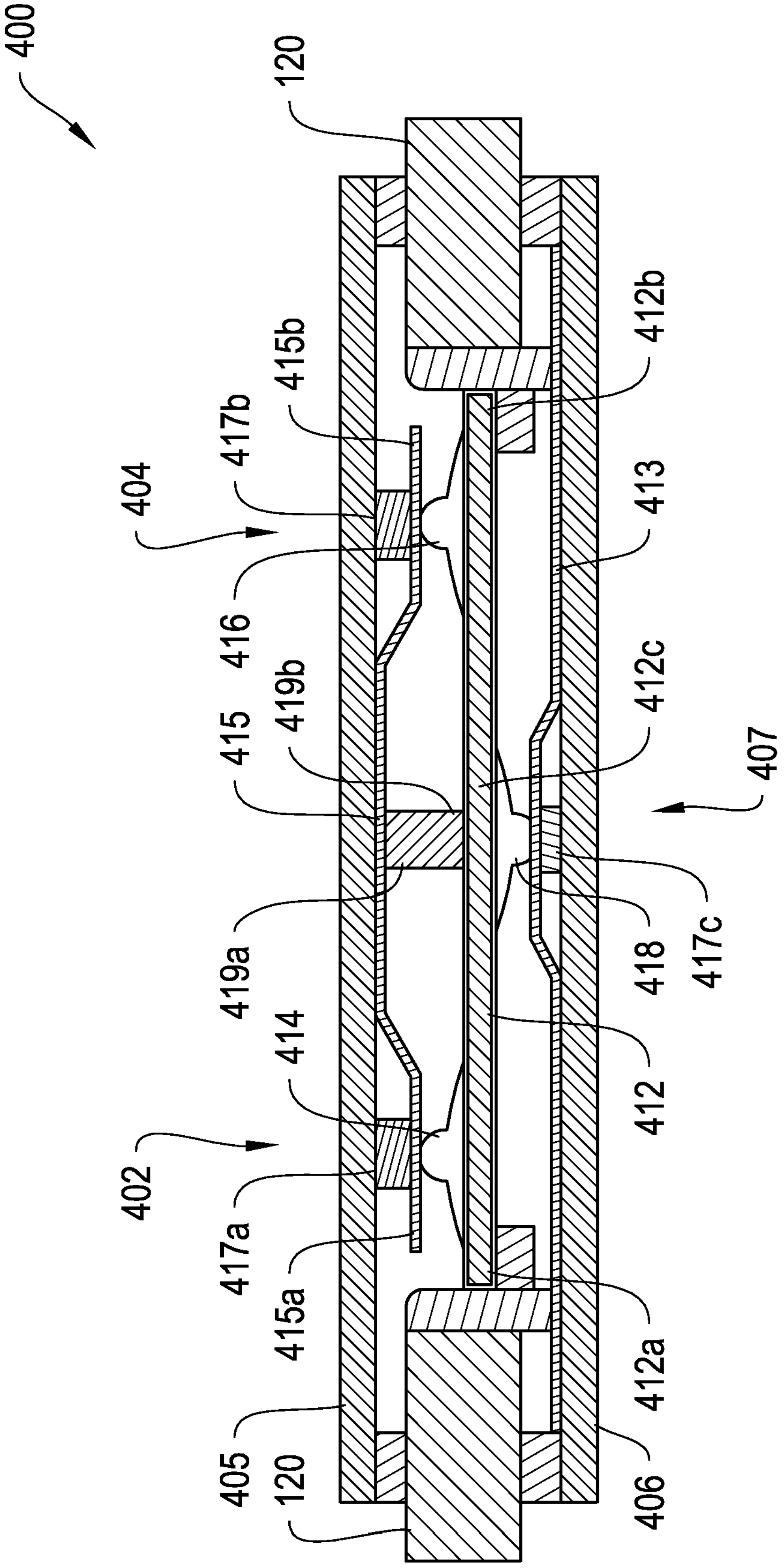
FIG. 5 is a cross-sectional view of the input device of FIG. 4 in accordance with one embodiment of the invention.

FIG. 5 is a cross-sectional view of the input device 400 of FIG. 4 in accordance with one embodiment of the invention. The view of FIG. 5 is along the longitudinal axis 4A of the input device 400 of FIG. 4. The input device 400 may include one or more switches (e.g., electrical switches) operative to be actuated to provide different inputs. The switches 414 and 416 may be coupled to one surface of the circuit board 412, and the switch 418 may be coupled to the opposite surface of the circuit board 412. In other embodiments (not pictured), the switches 414, 416, and 418 are all coupled to the same surface of the board 412. In some instances, the switches 414, 416, and 418 are electrical switches.

The input device 400 may also include a plate 415, which may be directly or indirectly coupled to the top shell 405. In certain instances, the plate 415 has a first end 415*a* and a second end 415*b* and may extend primarily parallel to the longitudinal axis 4A of the input device 400. The switch 414 may be placed in direct or indirect contact with the first end 415*a* of the plate 415, and the switch 416 may be placed in direct or indirect contact with the second end 415*b* of the plate 415, such that the user may actuate only one of the switches 414 and 416 at one time by pressing on one of the ends of the plate, for example by pressing on the leftmost section 402 of the top shell 405 or on the rightmost section 404 of the top shell. In certain instances, pressing on the leftmost section 402 causes the plate 415 to pivot about the pivot 419*a* such that the second end 415*b* moves away from the switch 416, and as a result the switch 414 is actuated and simultaneous actuation of the switch 416 is precluded. A corresponding outcome can occur on pressing of the rightmost section 404 to actuate the switch 416. In certain embodiments, actuation of the switch 414 or 416 shortens the switch and provides an electrical signal to transmit an input to the electronic device.

The input device 400 may also include a plate 413, which may be directly or indirectly coupled to the bottom shell 406. The plate 413 may be placed in direct or indirect contact with the switch 418. When the bottom shell 406 is pressed towards the top shell 405, the plate 413 may depress the switch 418, which, in certain instances, shortens the switch and provides an electrical signal to transmit an input to the electronic device.

In certain instances, the first and second ends 415*a* and 415*b* of the plate 415 are in direct or indirect contact with the standoffs 417*a* and 417*b*, respectively. Similarly, in some embodiments, the plate 413 is in direct or indirect contact with the standoff 417*c*. The standoffs may be made in whole or in part from plastic and/or metal (such as aluminum or stainless steel), or a composite material. In some instances, the standoffs can reduce the distance by which the shell portions need to be depressed to actuate the switches. Moreover, the standoffs can be tailored to control this distance and to control the amount of force required to actuate the buttons. For example, the standoff 417*a* can be made longer (or shorter) such that the leftmost section 402 can actuate the switch 414 by being depressed a shorter (or longer) distance. Moreover, the standoff 417*a* can be made longer (or shorter) such that application of a lesser (or greater) amount of force to the leftmost section 402 actuates the switch 414. Standoffs 417*b* and 417*c* can be similarly adjusted.

The standoff 417*a* can be made of a material whose compressability (e.g., sponge or foam-like material) can be tuned to control the amount of force required to actuate switch 414 on pressing of the leftmost section 402. Additionally, the standoff 417*a* can be made of a compressed material that ensures that the standoff is in constant contact with the leftmost section 402, the first end 415*a* of the plate 415, and/or the switch 414. For example, when the first end 415*a* of the plate 415 moves away from the switch 414, the standoff may provide an opposing force that permits the first end to remain in contact with the switch. The standoffs 417*b* and 417*c* can also be optionally made of such a material and behave in such a fashion.

In some embodiments, the circuit board 412 is freely floating or free standing within the input device 400. For example, the board 412 may not be rigidly secured or not fixedly coupled to the top shell 405 or the bottom shell 406 or to any other component of the input device 400. In certain embodiments, although not fixedly coupled, the board 412 may still simultaneously be retained and/or secured by one or more components of the device 400, such as the frames 420*a* and 420*b*, which are discussed in detail below. In some instances, when the board 412 is freely floating or free standing, it is retained and/or secured within the input device 400 by being constrained by surrounding elements of the device, for example, by one or both of the top and bottom shells 405 and 406; by one or more of the standoffs 417*a*, 417*b*, and 417*c*; by one or both of the plates 415 and 413; by one or both of the pivots 419*a* and 419*b*; by the frames 420*a* and 420*b*; or any combination thereof. In some embodiments, a microphone may be used in conjunction with a freely floating board or a board that is not fixedly coupled to improve microphone performance.

The circuit board 412 is optionally flexible or bendable, for example, such that pressing of the center section 407 of the shell 406 may cause the board to flex or bend. For instance, pressing on the center section 407 to actuate switch 418 may cause the center portion 412*c* of the board 412 to flex toward the top shell 405 and cause the first and second ends 412*a* and 412*b* of the board to flex away from the top shell 405 and toward the bottom shell 406. When the first and second ends 412*a* and 412*b* flex away from the top shell 405, they also flex away from the switches 414 and 416, thereby ensuring that the switches 414 and 416 are not actuated when the center section 407 is depressed, i.e., when the switch 418 is actuated. The flexing of the first and second ends 412*a* and 412*b* may be further tuned by adjustment of the standoffs 417*a* and 417*b*. For example, longer standoffs may increase flexing or bending of the first and second ends 412*a* and 412*b* away from the top shell 405.

In other embodiments, the circuit board 412 is secured at one or both of the first end 412*a* and the second end 412*b*. In this embodiment, the circuit board 412 may also be flexible, for example, such that pressing of center section 407 may cause the board to flex or bend. For instance, pressing on the center section 407 to actuate switch 418 may cause the center portion 412*c* of the board 412 to flex or bend toward the top shell 405. However, as the first and second ends 412*a* and 412*b* are secured, these may not flex or bend toward the bottom shell 406 but rather remain substantially fixed in position.

In some instances, the circuit board 412 is secured at the center portion 412*c*. In this embodiment, the circuit board 412 may also be flexible. When the board 412 is flexible and secured at the center portion 412*c*, depressing of the leftmost section 402 may cause the first end 412*a* to flex while the right most section 412*b* remains relatively unmoved and/or unflexed. A corresponding result occurs when the right most section 404 is depressed.

In an alternate embodiment, the circuit board 412 is secured at the center portion 412*c*, but the board is relatively inflexible or rigid. In such cases, the board maybe pivotable.

For example, pressing on the leftmost section 402 together with the bottom shell 406 may causes the board to pivot at the center portion 412*c* about the pivot 419*b* such that the first end 412*a* moves toward the top shell 405 to actuate the switch 414, and the second end 412*b* moves away from the top shell 405 and away from the second end 415*b* of the plate 415. As a result, depressing of the leftmost section 402 and actuation of the switch 414 can preclude actuation of the switch 416 since the switch 416 moves away from the second end 415*b* of the plate 415 when the board 412 pivots. In embodiments where the board 412 pivots, to facilitate pivoting the board may not be secured at the first and second ends 412*a* and 412*b*.

In some instances, wherein the circuit board 412 is either flexible or relatively inflexible or rigid, pressing on the leftmost section 402 together with the bottom shell 406 may cause the first end 412*a* to move toward the top shell 405 to actuate the switch 414. In such instances, the second end 412*b* may not move at all or may move a distance that is relatively shorter than that of the distance moved by the first end 412*a*. For example, the second end 412*b* may move toward the rightmost section 404 but not by a sufficient distance to actuate the switch 416 since the second end may move toward the rightmost section by a shorter distance than by which the first section 412*a* moves toward the leftmost section 402.

When the circuit board 412 is flexible, the flexibility can be tailored to tune the amount of pressure that causes the board to flex and/or bend and thus the amount of pressure required to actuate one or more switches. The flexibility of the board can be tailored through the use of materials of differing flexibility.

In instances where the switches 414, 416, and 418 are on the same side of the circuit board 412 (not pictured), the input device may include one or more standoffs in between each of the switches to prevent actuation of a neighboring switch on actuation of a desired switch. In such embodiments, the top shell 405, which is on the same side of the circuit board 412 as the switches 414, 416, and 418, maybe a flexible shell (i.e., made from a flexible material), and the bottom shell 406 may be a relatively inflexible shell (i.e., made from relatively inflexible materials).

Figure 6:
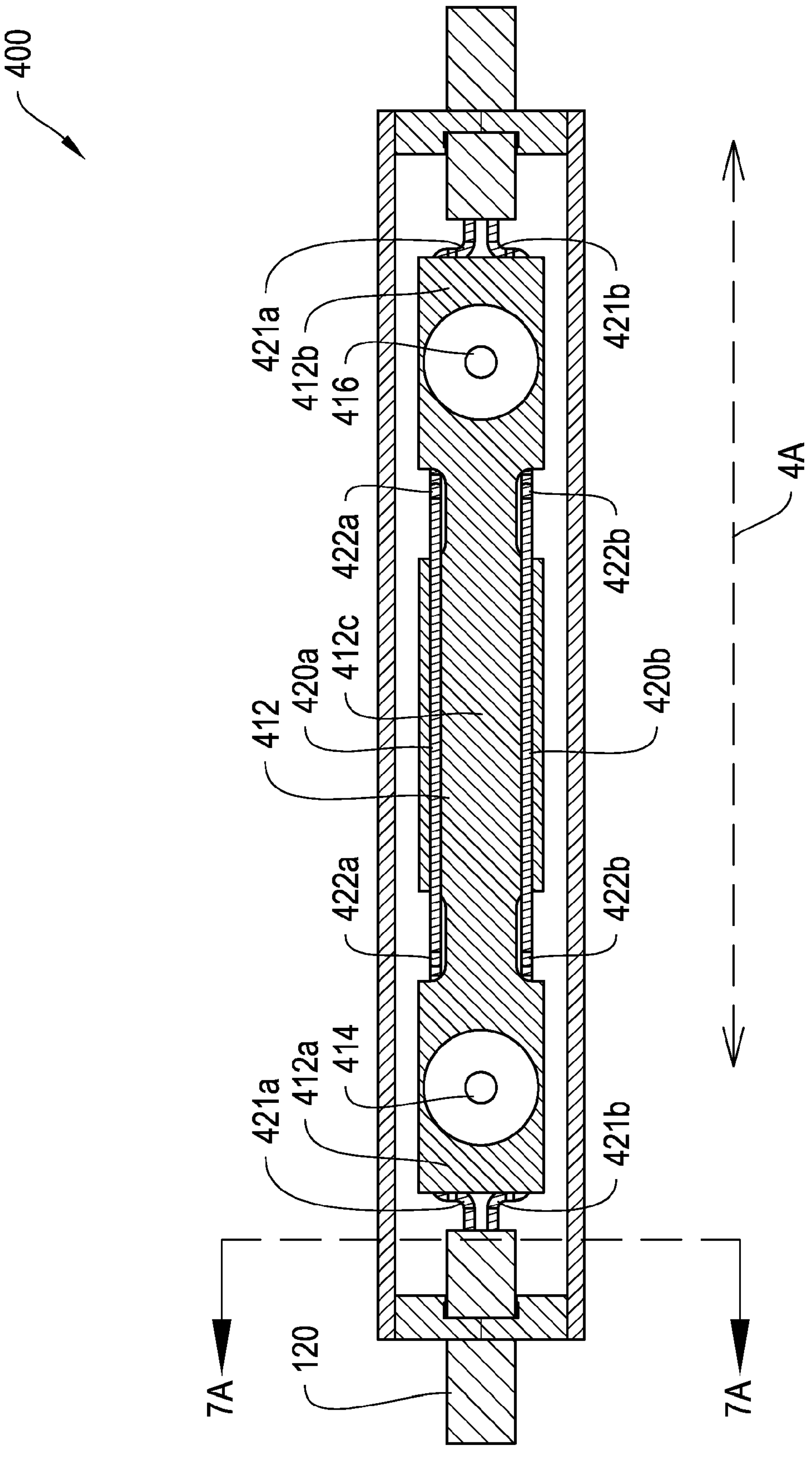
FIG. 6 is a top view of the input device of FIGS. 4 and 5 in accordance with one embodiment of the invention.

FIG. 6 is a top view of the input device 400 of FIGS. 4 and 5 in accordance with one embodiment of the invention. In FIG. 6 the top shell 405, the plate 415, the standoffs 417*a* and 417*b*, and the pivots 519*a* and 519*b* are not pictured for clarity. As seen in FIG. 6, the switches 414 and 416 are located at the opposite ends 412*a* and 412*b* of the circuit board 412. The switch 418 is on the opposite side of the board 412 and is not pictured. As noted above, in some embodiments (not pictured), the switch 418 is on the same side of the board 412 as the switches 414 and 416. In other embodiments, the switch 418 is not present at all. As noted above, the board 412 may be flexible or rigid.

The input device 400 may further include frames 420*a* and 420*b*, which may be made in whole or in part from plastic and/or metal (such as aluminum or stainless steel), or a composite material. The frames 420*a* and 420*b* may run substantially parallel to the longitudinal axis 4A of the device 400, although certain portions of the frames may also run non-parallel, e.g., perpendicular, to the longitudinal axis 4A. For example, the frame 420*a* may extend toward the frame 420*b* as shown for the portions 421*a*, and the frame 420*b* may extend toward the frame 420*a* as shown for the portions 421*b*. In another instance, the frame 420*a* may extend perpendicular to the axis 4A, such as into the plane of FIG. 6, as in the portions 422*a*. Similarly, the frame 420*b* may extend perpendicular to the axis 4A, such as into the plane of FIG. 6, as in the portions 422*b*. Generally, the frames 420*a* and 420*b* may bend and curve within the input device 400, but their overall progression is substantially parallel to that of the longitudinal axis 4A. In some embodiments, the frames 420*a* and 420*b* extend the length of the circuit board 412. In certain embodiments, the frames 420*a* and 420*b* represent two portions of a single frame.

In some instances, the frames 420*a* and 420*b* are flexible; in other embodiments, they are relatively rigid. The frames 420*a* and 420*b* may be solid, or they may be hollow and possess an internal lumen. When hollow, the frames 420*a* and 420*b* may include within the lumen one or more wires for carrying an electrical current. In some instances, one frame may be solid and the other hollow with the latter optionally carrying wires.

In the illustrative embodiment of FIG. 6, the circuit board 412 is freely floating within the input device 400; that is, the board is not rigidly secured or not fixedly coupled to any one portion of the input device. As seen in FIG. 6, the board 412 lies on top of the frames 420*a* and 420*b* near the end portions 412*a* and 412*b* of the board, for example, in the vicinity of the switches 414 and 416. At the same time, the board 412 may also lie under the frames 420*a* and 420*b*, for example, near the edges of the center portion 412*c* of the board, and portions of the center portion of the board may project out from under the frames. Hence, in some embodiments, the board 412 weaves above and below the first and second frames 420*a* and 420*b*. The positioning of the circuit board 412 at once on top of the frames 420*a* and 420*b* in one or more portions and under the frames in one or more other portions (weaving) permits the board to be retained by the input device 400, in particular, by being retain by the frames 420*a* and 420*b*, but also allows the board to be free floating without rigidly securing the board and without fixedly coupling the board to the frames or to any other component of the input device. Although the embodiment pictured in FIG. 6 includes two portions of the board 412 on top of the frames 420*a* and 420*b* and one portion of the board under the frames, other combinations are also contemplated, e.g., 2, 3, 4, or 5 portions on top of the frames and 2, 3, 4, or 5 portions under the frames or any combination thereof. In certain embodiments, the frames or frame defines a periphery and the circuit board is maintained substantially within the periphery.

Figure 7A:
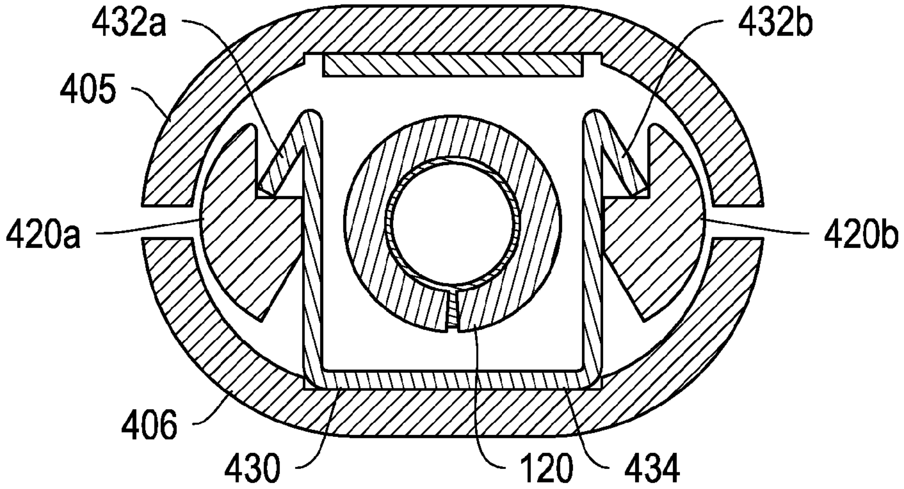
FIGS. 7*a-c* are cross-sectional views of the input device of FIG. 6 in accordance with one embodiment of the invention.
Figure 7B:
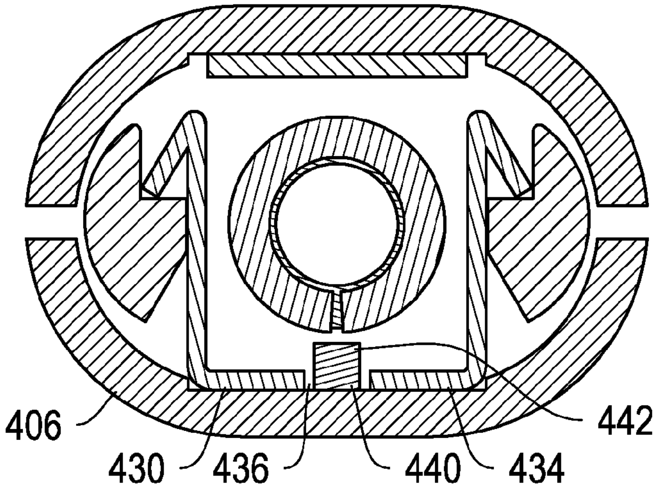
Figure 7C:
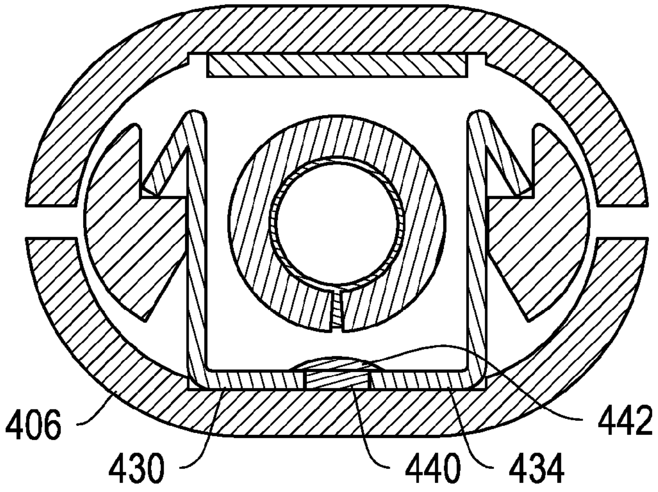

FIGS. 7*a-c* are cross-sectional views of the input device 400 of FIG. 6 in accordance with one embodiment of the invention. The views in FIGS. 7*a-c* are along the plane 7A of FIG. 6 except the top shell 405 is now pictured. As seen in FIG. 7, in certain embodiments, the top shell 405 and/or the bottom shell 406 are not directly attached to one another or to the frames 420*a* and 420*b*. Rather, one or more clips 430 may secure the bottom shell 406 to the frames 420*a* and 420*b*, for example by engaging the frames, such as by folding over the frames at the ends 432*a* and 432*b*. In some embodiments, one or more clips 430 secures the top shell 405 to the frames 420*a* and 420*b*. In certain instances, one or more clips may secure the top shell 405 to the frames 420*a* and 420*b*, while one or more additional clips secure the bottom shell 406 to the frames. Securing the top shell 405 and the bottom shell 406 to the frames 420*a* and 420*b* may, in some instances, bring the two shells together.

The clip 430 may be made in whole or in part from plastic and/or metal (such as aluminum or stainless steel, particularly stainless steel), or a composite material.

Although the clip 430 is depicted as substantially U-shaped in FIGS. 7*a-c*, in other embodiments, the clip may be V-shaped, circular, semi-circular, square, triangular, etc. The input device 400 may include 1, 2, 3, 4, 6, 8, or more clips to secure the top shell 405 and/or the bottom shell 406 to the frames 420*a* and 420*b*. In particular embodiments, the input device 400 includes 4 clips to secure the top shell 405 and the bottom shell 406 to the frames 420*a* and 420*b*. For example, in some instances, the input device 400 may include two clips coupled to the bottom shell 406, one at each longitudinal end of the bottom shell, and two clips coupled to the top shell 405, one at each longitudinal end of the top shell.

In certain embodiments, the circuit board 412 is secured to the frames 420*a* and 420*b* by 4 clips 430. In such embodiments, two clips secure the first end 412*a* of the board 412 to the frames 420*a* and 420*b*, and the remaining two clips secure the second end 412*b* of the board to the frames. In such embodiments, one of the two clips securing the first end 412*a* of the board 412 may be coupled to the top shell 405 and the other may be coupled to the bottom shell 406. Similarly, one of the two clips securing the second end 412*b* of the board 412 may be coupled to the top shell 405 and the other may be coupled to the bottom shell 406. Clips coupled to opposing shells (opposing clips) may be longitudinally staggered with respect to one another so that when the two shells are brought together, the opposing clips are longitudinally adjacent one another, thereby more efficiently using the internal space within the device and permitting the device to be smaller in size.

The clip 430 may include a base 434 which may be attached or coupled to the bottom shell 406 (and/or the top shell 405) through adhesives, other clips or fasteners, heat bonding, etc. As seen in FIG. 7*b*, in some instances, the clip 130 includes an aperture or hole 436 in the base 434. In some embodiments, the bottom shell 406 includes a post 440 that projects internally, i.e., toward the top shell 405. In certain cases, the post 440 is sized and shaped to fit through the aperture 436. A top portion 442 of the post 440 may protrude through the aperture 436. The post 440 may be composed of a plastic or other material which may have a melting temperature greater than normal usage temperature for the device 400, for example, a temperature greater than 50, 75, 100, 150, 200° C. As seen in FIG. 7*c*, when the post 440 is heated above the melting temperature, the post may expand to fill the aperture 436, and the portion of the post 434 that protrudes from the clip 430 may become flattened and expand to cover the aperture partially or completely (i.e., the post may be shape-welded to the clip), thereby securing the clip 430 to the bottom shell 406. The aperture 436 can be circular, triangular, rectangular, square, etc., and the post 440 when melted can then expand to fill the shape of the aperture. The top portion 442 of the post 440 may be melted into various shapes. For example the top portion 442 may be melted into a flat shape to provide added room within the device 400 to accommodate additional components, such as wires. The top portion 442 may also be melted into a curved shape to be compatible with a curved bottom shell 406.

In some embodiments (not pictured), the post 440 is part of the top shell 405 and the clip 430 associates with the top shell. In instances where the input device 400 employs a plurality of clips 430, a plurality of posts 440 may be used to secure the clips to the bottom shell 406, the top shell 405, or both. A given clip 430 may be secured to a shell through 1, 2, 3, 4, or more posts 440.

Although in the embodiment pictured in FIGS. 7*a-c*, the clip 430 is generally U-shaped with two ends 432*a* and 432*b*, in other embodiments a clip may include two or more U-shaped portions, each with ends analogous to 432*a* and 432*b*. For example, a clip may include two U-shaped portions each with two ends that may engage the frames. In such an embodiment, the clip may include a flat base, similar to the base 432, which includes a U-shaped portion at each longitudinal end and one or more apertures 436 for receiving one or more posts 440 for coupling the clip to a shell.

In certain embodiments, the input device does not include frames, for example to conserve space within the device and to present a device that is smaller in size. In such embodiments, the device may include one or more clips, as described above, coupled to the top and/or bottom shell that engage the opposing shell to couple the two shells together.

Various features (e.g., the circuit board 412, the plates 413 and 415, the frames 420*a* and 420*b*, the clip 430, the post 440, etc.) described above in association with the input device 400, may also be used in other input devices described herein (e.g., 100, 300, 800, and 900).

Figure 8:
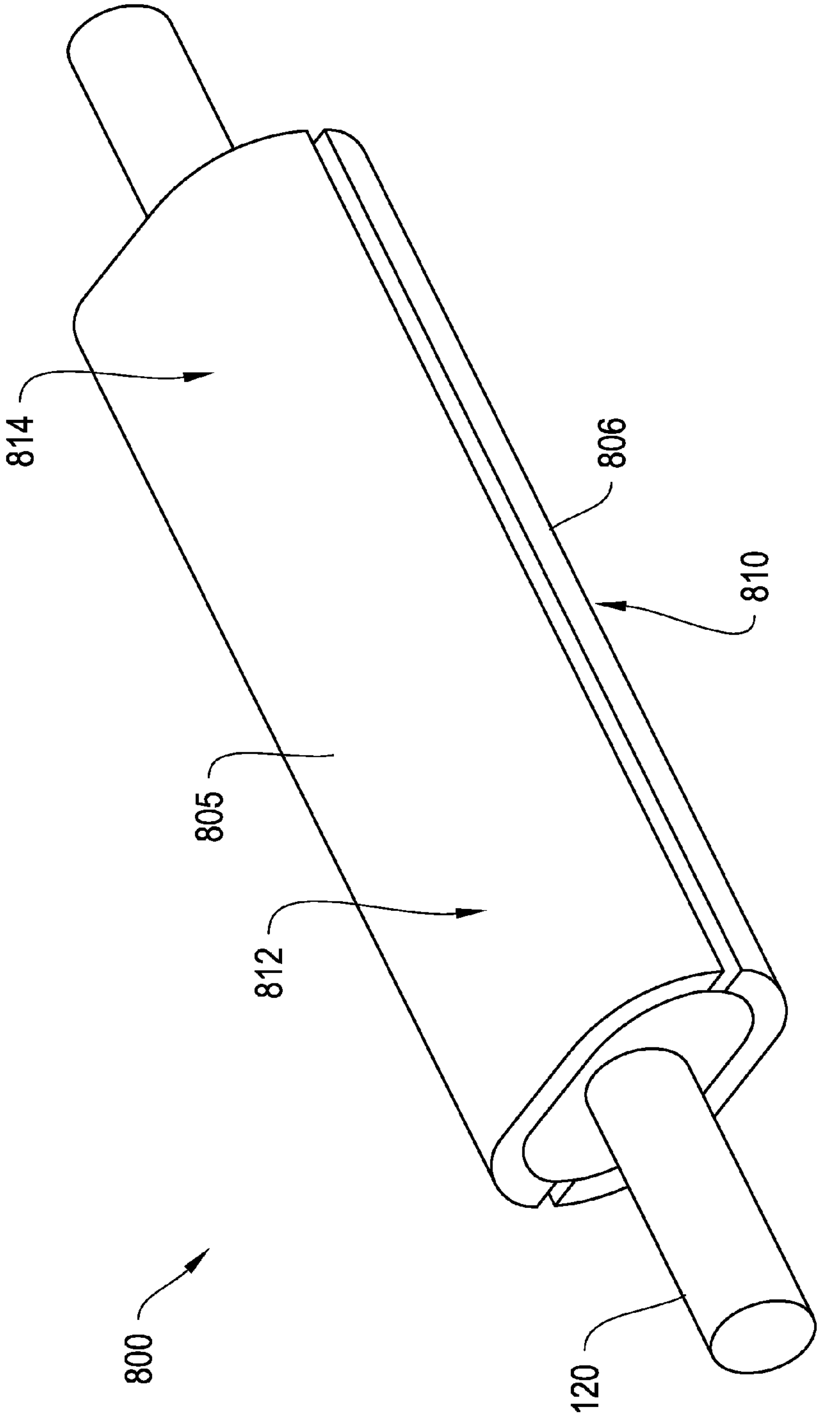
FIG. 8 is a schematic view of an input device having a mechanical button and two capacitive buttons in accordance with one embodiment of the invention.

FIG. 8 is a perspective schematic view of an input device 800 having a mechanical button and two capacitive buttons in accordance with one embodiment of the invention. The input device 800 may include a top shell 805 and a bottom shell 806. The input device 800 may include a mechanical button 810, which may include a switch (e.g., an electrical switch) inside the input device 800 that may be actuated by pressing the bottom shell 806 towards the top shell 805. The input device 800 may include a first capacitive button 812 and a second capacitive button 814 located on or adjacent the top shell 805. The user may actuate the capacitive buttons 812 and 814 by placing a finger over a capacitive sensor associated with each button (e.g., and incorporated in top shell 805). In some embodiments, the input device 800 may include any suitable number of mechanical buttons and capacitive buttons. Other features described above for the input devices 100, 300, and 400 may also be used in combination with the input device 800. Additionally, the above features described for the input device 800 may also be used in combination with the input devices 100, 300, and 400.

Figure 9:
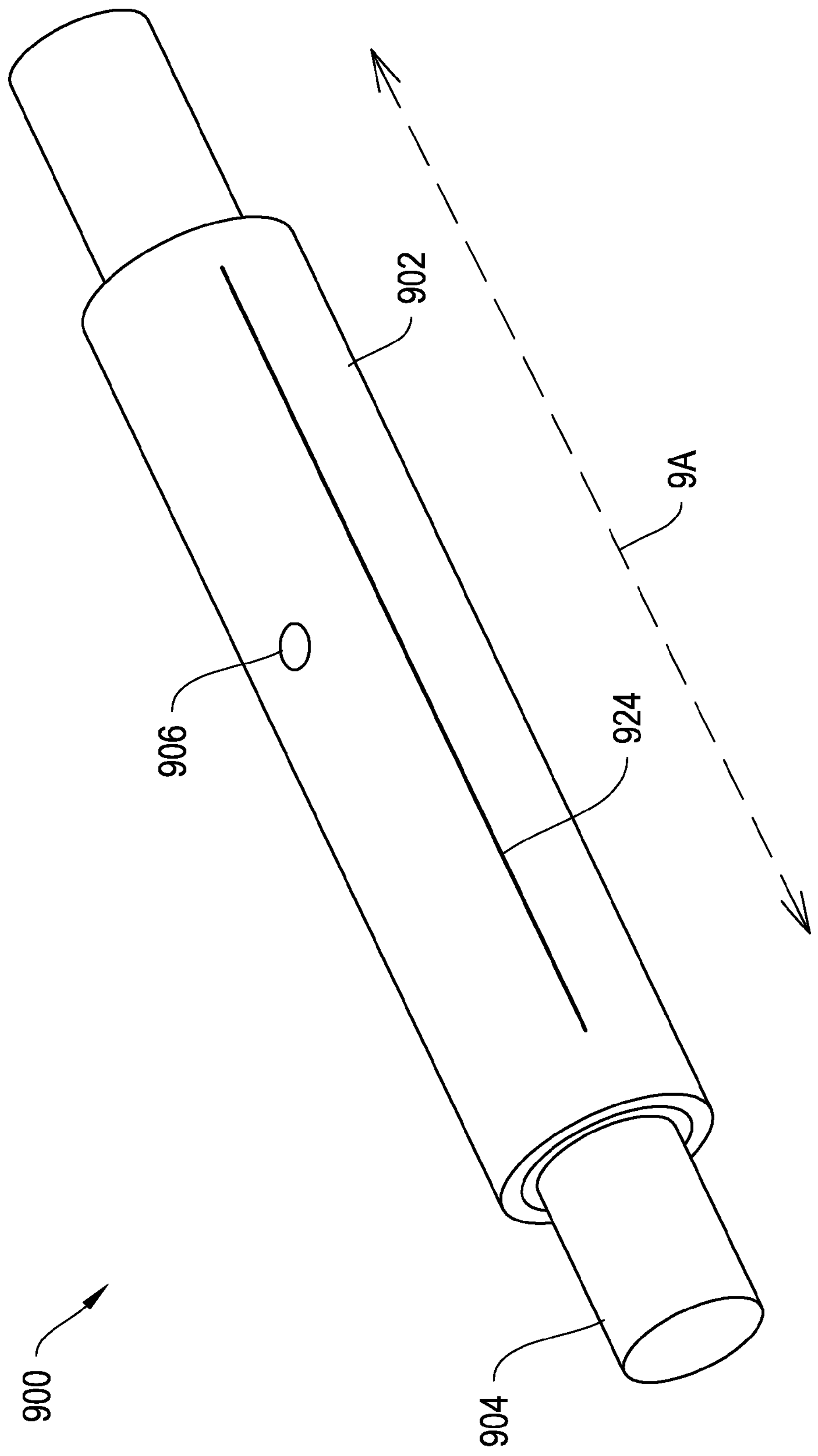
FIG. 9 is a schematic view of an input device that includes only a microphone in accordance with one embodiment of the invention.
Figure 10:
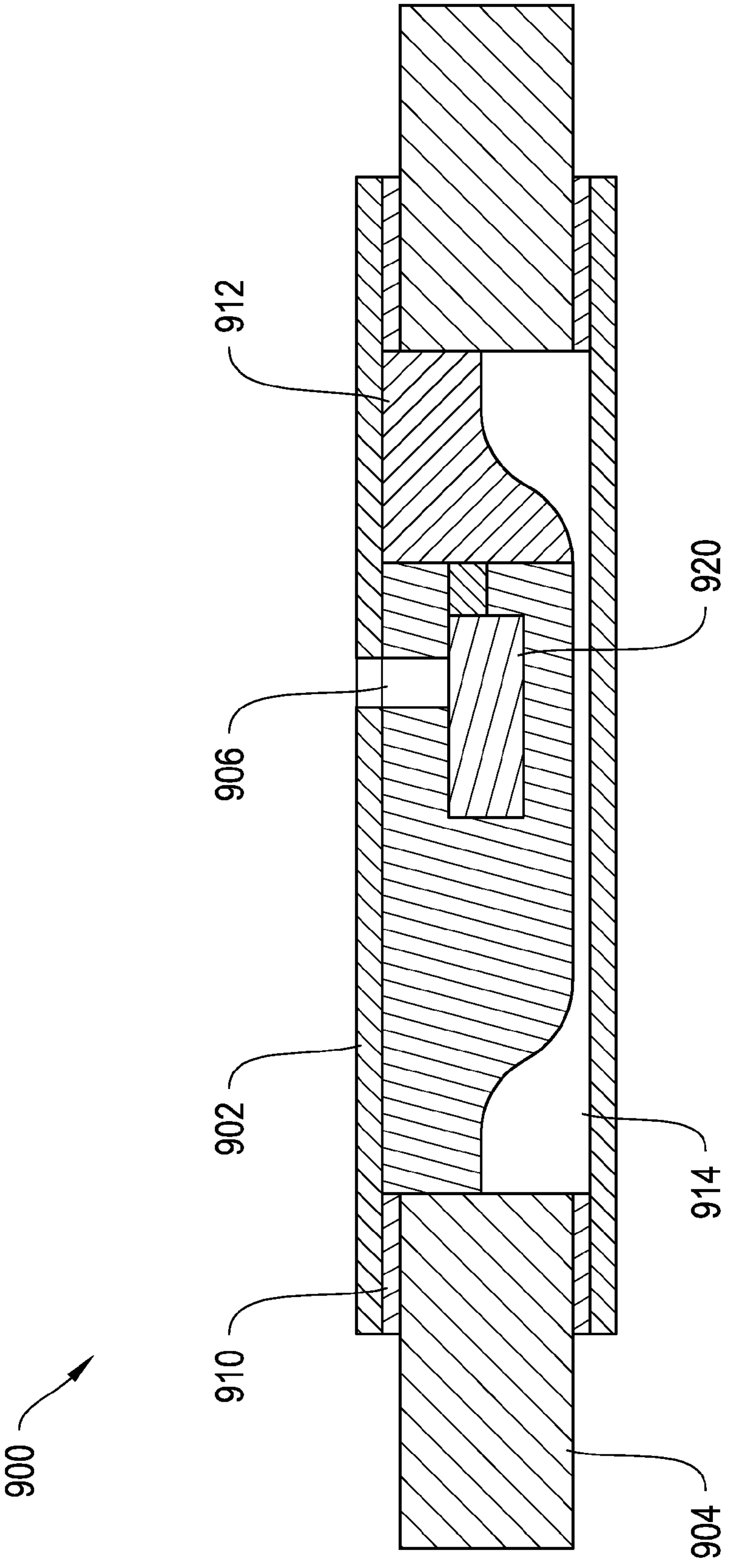
FIG. 10 is a cross-sectional view of the input device of FIG. 9 in accordance with one embodiment of the invention.

FIG. 9 is a schematic view of an input device 900 that includes only a microphone in accordance with one embodiment of the invention. FIG. 10 is a cross-sectional view of the input device of FIG. 9 in accordance with one embodiment of the invention. The input device 900 may include a cylindrical shell 902 placed over a cable 904. The shell 902 may be manufactured from any suitable material, including for example plastic, metal (e.g., aluminum or stainless steel), or a composite material. The shell 902 may include an aperture 906 operative to allow audio (e.g., from a user) to pass to a microphone placed inside the input device 900. In some embodiments, the device 900 includes a plurality of apertures 906. In other embodiments (not pictured), the device 900 does not include the aperture 906.

The cable 904 may be coupled to the shell 902 using any suitable approach. In some embodiments, the cable 904 may be coupled directly to the shell 902 (e.g., using a press fit, a shrink fit, or an adhesive). In some embodiments, the input device 900 may include an over-molded thermoplastic elastomer (TPE) portion 910 located between the cable 904 and the inner surface of the shell 902. The TPE portion 910 may be operative to provide strain relief to the connection between the shell 902 and the cable 904. The input device 900 may include a plug 912 adjacent to the cable 904 (e.g., at one or both ends of the input device 900) to maintain even strain relief.

In some embodiments, the input device 900 may include a microphone 920, which may be placed adjacent the aperture 906 to allow sound waves to travel through the shell 902 to the microphone 120. In certain embodiments, the microphone 920 is not placed adjacent the aperture 906. The input device may include a clearance 914 underneath the microphone 920 operative to receive audio cables or wires (e.g., for left and right audio channels, a microphone channel, and/or a ground source) passing through the input device 900 and to one or more speakers, headphones, or earbuds.

In other embodiments, the input device 900 includes a microphone 920, but does not include an aperture 906. In such embodiments, there may be one or more cracks, partitions, gaps, or separations between the shell 902 and the cable 904, for example, when there is not a tight seal between the cable and the shell, for instance if the TPE portion 910 is omitted or reduced in size. Such cracks, partitions, gaps, or separations may allow sound waves to pass through the shell 902 to the microphone 920. Additionally, with reference to FIG. 9, the shell 902 may include one or more slits or partitions 924, which also permit sound waves to pass through the shell 902 and to the microphone 920. In some instances, the slits or partitions 924 may extend substantially parallel to the longitudinal axis 9A of the input device 900 and thus be substantially parallel to the cable 904 and to any wires passing longitudinally through the device 900.

The input device 900 may have any suitable size. In some embodiments, the total length of the device 900 may be from about 10 mm to about 19 mm, such as about 13.9 mm±1 mm, and the diameter of the shell 902 (e.g., the total height of the device 900) may be from about 1.5 to about 5 mm, such as about 3 mm±0.2 mm. The different components of the input device 900 may have any suitable height. For example, the cable 904 may have a thickness (e.g., diameter) from about 1.5 mm to about 2.5 mm, such as about 2 mm±0.2 mm. As another example, the microphone 920 may have a thickness from about 0.65 mm to about 1 mm, such as about 0.87 mm±0.1 mm.

As noted above, the input devices 100, 300, 400, and 800 provide means to actuate one or more switches, such as electrical switches, that in certain instances provide an electrical signal to provide one or more inputs to an electrical device. In certain embodiments, the input devices 100, 300, 400, 800, and 900 include a microphone which can also provide an input to an electrical device. In some embodiments, the electrical signal is transmitted through one or more cables or wires which are connected to the circuit boards 112 or 412 and are optionally housed within the cables 120 and 904. In certain embodiments, 2, 3, 4, 5, or 6 cables, particularly 4 cables, may be used to transmit electrical signals (e.g., left channel, right channel, ground, and microphone).

The present disclosure contemplates all combinations of features and elements disclosed herein. For example, various embodiments of input devices shells, buttons, switches, circuit boards, frames, clips, posts, microphones, and other features described herein are interchangeable, unless explicitly stated otherwise. In particular, the interchangeability of elements with similar functions (e.g., shells 105, 305, 405, and 605) is contemplated. As such, combinations of these elements and embodiments, if not explicitly stated, are contemplated and within the scope of the disclosure.

The contents of all references, patents and published patent applications cited throughout this Application, as well as their associated figures are hereby incorporated by reference in entirety. For example U.S. Provisional Patent Application No. 61/020,988, filed Jan. 14, 2008 and the U.S. patent application Ser. No. 12/203,876 entitled "ELECTRONIC DEVICE ACCESSORY" to Wendell Sander et al., filed on or about the same day as the present application, are hereby incorporated by reference in their entirety.

Equivalents

Variations, modifications, and other implementations of what is described herein will occur to those of ordinary skill without departing from the spirit and the scope of the claimed invention. Hence, many equivalents to the specific embodiments of the claimed invention and the specific methods and practices associated with the systems and methods described herein exist and are considered to be within the scope of the claimed invention as covered by the following claims. For additional illustrative features that may be used with the claimed invention, including certain embodiments described here, refer to the documents which are listed herein above and are incorporated by reference in their entirety.

The invention claimed is:

1. An input device, comprising:
a housing defining an interior volume;
a circuit board;
a first electrical switch disposed on a first side of the circuit board;
a second electrical switch disposed on a second side of the circuit board; and
a pair of frame elements, each frame element comprising:
a first portion;
a second portion;
a third portion;
a first linking portion connecting the first and second portions; and
a second linking portion connecting the second and third portions wherein:
the top surfaces of the first and third portions of the pair of frame elements define a first plane;
the bottom surfaces of the second portions of the pair of frame elements define a second plane that is parallel to and offset from the first plane; and
the circuit board is disposed between the first plane and the second plane.

2. The input device of claim 1, wherein the input device further comprises at least one of a cable or a wire operative to connect the input device to an electronic device.

3. The input device of claim 1, wherein the pair of frame elements retains the circuit board to the input device while allowing the circuit board to float relative to the pair of frame elements.

4. The input device of claim 1, wherein:
the first and second linking portions are transverse to the first and the second planes; and
the first and second linking portions each extend through a respective a cut-out in the circuit board.

5. The input device of claim 1, wherein:
the housing is an elongate housing extending along a longitudinal direction;
the first, second, and third portions of the pair of frame elements are substantially parallel to the longitudinal direction; and
the first and second linking portions of the pair of frame elements are substantially perpendicular to the longitudinal direction.

6. An input device, comprising:
a flexible circuit board;
an electrical switch disposed on a first side of the circuit board; and
first and second shells that house the circuit board, the first shell placed over the first side of the circuit board, and the second shell placed over a second side of the circuit board;
wherein the circuit board flexes when at least one of the first shell is pressed towards the second shell, the second shell is pressed towards the first shell, or both the first and second shells are pressed towards one another.

7. The input device of claim 6, wherein at least one of the first shell or the second shell is formed of a single piece of material.

8. The input device of claim 6, wherein at least one of the first shell or the second shell is formed of at least one of plastic or metal.

9. The input device of claim 6, wherein at least one of the first shell or the second shell is flexible.

10. The input device of claim 6, wherein the input device further comprises at least one of a cable or a wire operative to connect the input device to an electronic device.

11. The input device of claim 6, wherein the input device provides different signals based on presses of different locations of at least one of the first shell or the second shell.

12. An input device, comprising:
a circuit board;
an electrical switch disposed on a first side of the circuit board;
a first shell and a second shell that house the circuit board, the first shell placed over the first side of the circuit board, and the second shell placed over a second side of the circuit board; and
a frame within the input device, wherein:
the frame retains the circuit board to the input device while allowing the circuit board to float relative to the frame;
at least one of the first shell and the second shell is secured to the frame; and
the circuit board flexes when at least one of the first shell is pressed towards the second shell, the second shell is pressed towards the first shell, or both the first and second shells are pressed towards one another.

13. The input device of claim 12, wherein at least one of the first shell or the second shell is formed of a single piece of material.

14. The input device of claim 12, wherein at least one of the first shell or the second shell is formed of at least one of plastic or metal.

15. The input device of claim 12, wherein at least one of the first shell or the second shell is flexible.

16. The input device of claim 12, wherein the input device further comprises at least one of a cable or a wire operative to connect the input device to an electronic device.

17. The input device of claim 12, wherein the input device provides different signals based on presses of different locations of at least one of the first shell or the second shell.

18. An input device, comprising:
a circuit board;
a first electrical switch disposed on a first side of the circuit board;
a second electrical switch disposed on a second side of the circuit board;
a frame defining a periphery, wherein the circuit board is maintained within the periphery of the frame;
first and second shells that house the circuit board, the first shell placed over the first side of the circuit board, and the second shell placed over the second side of the circuit board; and
at least one clip coupled to each one of the first shell and the second shell, wherein:
the at least one clip is operative to engage the frame, and
the input device provides different signals based on presses of different locations of at least one of the first shell or the second shell.

19. The input device of claim 18, wherein at least one of the first shell or the second shell is formed of a single piece of material.

20. The input device of claim 18, wherein at least one of the first shell or the second shell is formed of at least one of plastic or metal.

21. The input device of claim 18, wherein at least one of the first shell or the second shell is flexible.

22. The input device of claim 18, wherein the input device further comprises at least one of a cable or a wire operative to connect the input device to an electronic device.

* * * * *